United States Patent [19]

Clark et al.

[11] 4,086,610
[45] Apr. 25, 1978

[54] HIGH RELIABILITY EPI-BASE RADIATION HARDENED POWER TRANSISTOR

[75] Inventors: Lowell E. Clark; Jack L. Saltich, both of Scottsdale, Ariz.

[73] Assignee: Motorola, Inc., Schaumburg, Illinois

[21] Appl. No.: 484,025

[22] Filed: Jun. 28, 1974

[51] Int. Cl.$^2$ ............................................. H01L 29/72
[52] U.S. Cl. ..................................... 357/34; 357/13; 357/58; 357/89; 357/29; 148/175
[58] Field of Search ....................... 357/13, 34, 58, 89, 357/29; 148/175

[56] References Cited

U.S. PATENT DOCUMENTS

| 3,427,515 | 2/1969 | Blicher et al. | 357/89 |
| 3,460,009 | 8/1969 | Kisinko et al. | 357/89 |

OTHER PUBLICATIONS

Denning et al., "Epitaxial pi-nu n-p-n High Voltage Power Transistors" *IEEE Trans. on Electron Dev.*, vol. ED 17, Sept. 1970, pp. 711–716.
Lauritzen et al., "Design Tradeoffs for Neutron . . . ", *IEEE Trans. on Nuclear Science*, Nov. 1964, pp. 39–46.

*Primary Examiner*—William D. Larkins
*Attorney, Agent, or Firm*—Vincent J. Rauner; Lowell E. Clark

[57] ABSTRACT

A high-voltage power transistor is hereinafter described which is able to withstand fluences as high as $3 \times 10^{14}$ neutrons per square centimeter and still be able to operate satisfactorily. The collector may be made essentially half as thick and twice as heavily doped as normally and its base is made in two regions which together are essentially four times as thick as the normal power transistor base region. The base region has a heavily doped upper region and a lower region intermediate the upper heavily doped region and the collector. The doping in the intermediate region is as close to intrinsic as possible, in any event less than about $3 \times 10^{15}$ impurities per cubic centimeter. The second base region has small width in comparison to the first base region, the ratio of the first to the second being at least about 5 to 1. The base region having the upper heavily doped region and the intermediate or lower low doped region contributes to the higher breakdown voltage which the transistor is able to withstand. The high doping of the collector region essentially lowers that portion of the breakdown voltage achieved by the collector region. Accordingly, it is necessary to transfer certain of this breakdown capability to the base region and this is achieved by using the upper region of heavily doped and an intermediate or lower region of low doping.

3 Claims, 12 Drawing Figures

ELECTRIC FIELD DISTRIBUTION IN CONVENTIONAL STRUCTURE

ELECTRIC FIELD DISTRIBUTION IN WIDE BASE STRUCTURE

EXPONENTIAL RESISTIVITY-FLUENCE DEPENDENCE OF UNIFORMLY DOPED SILICON IRRADIATED AT 297°K IN THE SPRF (9)

(Log Scale)

PLOT OF BREAKDOWN VOLTAGE VERSUS BACKGROUND CONCENTRATION IN SILICON (Log Scale)

PLOT OF CRITICAL FIELD FOR BREAKDOWN VERSUS BACKGROUND CONCENTRATION IN SILICON

HIGH RELIABILITY EPI-BASE RADIATION HARDENED POWER TRANSISTOR

BACKGROUND OF THE INVENTION

In the prior art structures the collector region is normally lower doped in order to withstand the breakdown expected of the transistor. The base is normally of one doping level, the type achieved with a heavy diffusion forming the base region. The metallurgical base is the width of the diffusion and it is normally a half to one micron. However, when such a transistor is subject to high neutron radiation, the neutrons effectively destroy the carriers present in the collector due to its impurity content and the collector region becomes high resistivity material and as such it is unable to function properly within design limits. In this event, the base attempts to compensate for the higher resistivity of the collector and the base effectively pushes into the collector region and injects carriers in order to attempt to function properly as designed. However, this reduces the gain and also reduces the breakdown voltage which the transistor is capable of withstanding, and the transistor is no longer able to function as required. As is well known, the current gain of a transistor is to a large extent determined by a lifetime in the base region. Once the transistor has been subject to the neutron fluences, the base effectively becomes the width of the metallurgical base, i.e., the diffusion plus the collector region. Hence, the gain is drastically reduced resulting in the transistor malfunction. The prior art has not suggested any way to build a high voltage, high current power transistor capable of withstanding high neutron radiation with reasonable yields.

SUMMARY OF THE INVENTION

The present invention relates to power transistors and, more particularly, relates to a high reliability epi-base radiation hardened transistor.

Another object of the present invention is the fabrication of a power transistor capable of withstanding high voltage breakdown.

A still further object of the present invention is to provide a radiation hardened power transistor capable of carrying relatively high currents.

Another object of the present invention is a fabrication of a radiation hardened power transistor having a base region comprising an upper region having an impurity profile established by diffusion, and a lower region having an impurity profile established in an epitaxial reactor.

Another object of the present invention is to provide a radiation hardened power transistor having a base region including a lower region of low impurity profile established in an epitaxial reactor.

A still further object of the present invention is to provide a radiation hardened power transistor having a voltage breakdown which is in part attributed to the doping impurity profile of the collector region and in part due to a base region having an upper region of heavily doped impurity profile and a lower or intermediate region of low impurity profile.

Another object of the present invention is to provide a radiation hardened power transistor having a collector region of essentially higher doping concentration than found in corresponding power transistors of the same breakdown voltage capability.

A still further object of the present invention is to provide a radiation hardened power transistor of a design wherein the collector region is essentially doped higher than in corresponding power transistor of the same breakdown capability, but having a divided base region including a lower base region of essentially low impurity concentration and an upper base region of essentially high impurity profile wherein the base region contributes a major portion of the breakdown capability which the power transistor is able to sustain.

Another object of the present invention is to provide a power transistor having a relatively high breakdown potential wherein the breakdown potential is sustained in part by a base region having an upper region of relatively high impurity profile and a lower region of relatively low impurity concentration and in part by a collector region having essentially higher doping concentration than in comparable power transistors of the same breakdown potential.

BRIEF DESCRIPTION OF THE INVENTION

Figure 1:
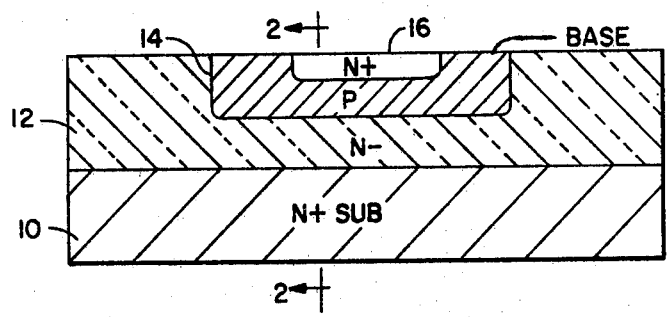
FIG. 1A shows a cross-sectional view of a standard power transistor.

A power transistor is disclosed which is capable of working in a normal ambient of low radiation and it is also capable of working after being subjected to a fluence of $3 \times 10^{14}$ neutrons per square centimeter. This means that the present invention is particularly directed to a transistor which is capable of operating within design limits prior to neutron radiation. The configurations and figures including impurity profiles are given hereinafter and relate especially to the configuration of the power transistor prior to neutron radiation. The power transistor of the present invention employs several novel features. The first feature is that the impurity concentration of the collector region is essentially higher than a conventional power transistor capable of sustaining a similar breakdown potential, and should have a substantially uniform doping profile across its width. Due to the difficulty of controlling doping levels with a high degree of precision "substantially uniform" is defined herein as having less than a 50 percent variation. The impurity concentration should be at least about 3 times the neutron fluence to which the transistor may be exposed, expressed as impurities per cubic centimeter, preferably between about 3 and about 6 times the neutron fluence. Below about 3 times the neutron fluence, the base extends into the collector region after irradiation, producing an unacceptably wide base reducing gain in the transistor. Above about 6 times the neutron fluence, the voltage capability of the transistor falls off. The higher impurity concentration of the collector is employed such that after sustaining the design neutron radiation, sufficient carriers are available for sustaining current flow through the base region. As a result of the collector region having a high impurity concentration, a breakdown potential of a relatively low value is obtainable by such high concentrations. Accordingly, additional techniques must be added to this transistor in order to increase the breakdown potential of the ultimate transistor. The technique employed for increasing the breakdown potential of the transistor is to use a base region of a first and second impurity profile. The base region is preferably made by epitaxial deposition and the region in contact with the collector region has a doping level as close to intrinsic as possible, in any event less than about $3 \times 10^{15}$ impurities per cubic centimeter. Above about $3 \times 10^{15}$ impurities per cubic centimeter, the voltage capability of the device is diminished to an undesirable extent. An upper region of higher impurity concentration is preferably formed by either diffusion or epitaxial formation. When the upper region is formed by diffusion, it has the impurity profile of a standard diffusion. When the upper region is formed in the epitaxial reactor, it is formed with a higher impurity concentration by increasing the impurity concentration available in the reactor. The higher doped second base region should have a total base doping no less than about $2 \times 10^{12}$ atoms per square centimeter. This doping is expressed in units of impurity per square centimeter rather than cubic centimeters because of the typical unevenness of impurity distribution across the width of this region. The emitter diffusion is of standard impurity profile.

The second base region should have a small width or thickness in comparison with the first base region, certainly less than about 1 micron. The ratio of the width of the first base region to the second base region should be at least about 5 to 1. The thickness of the first base region is determined by a level of radiation to which the transistor may be exposed and the desired gain of the transistor subsequent to the exposure. In general, it is desired to make the total base width in this transistor as wide as possible consistent with the desired gain to increase the breakdown voltage. In prior art designs, the base is made as narrow as possible for increased gain, but this results in lower breakdown voltages.

The collector region is made essentially thinner than a conventional transistor of the type being able to sustain the same breakdown potential. The base region including the first and second regions are approximately equal in thickness to the collector region and essentially four to five times as thick as normally found in power transistors of the same breakdown potential range. As an optimum, the total width of the base comprised of the two base regions should be related to the neutron fluence for which the transistor is designed and the post irradiation current gain, $\beta_{100}$, substantially in accordance with the relationship:

$$\text{Base Width in microns} = \left( \frac{4 \times 10^{16}}{\phi \beta_\phi} \right)^{\frac{1}{2}}$$

It will be appreciated that lifetime-controlled current gain $\beta$ is proportional to the lifetime divided by the square of the effective base width, and that the lifetime decreases inversely with fluence $\phi$. The above question expresses this composite relationship for the lifetime degradation engendered by high-energy neutrons according to current knowledge. Clearly, small changes in the numerical constant, or even modification to account for other lifetime-damaging irradiation, does not change the concept of the present invention.

Prior to neutron radiation, the breakdown potential of the transistor is achieved in part by the base region having two impurity profiles including the intermediate region of essentially low conductivity type and in part by the impurity concentration of the collector region. Prior to radiation, the collector region supplies a corresponding number of carriers to effectively conduct the holes injected by the base causing normal transistor action. However, after radiation by fast neutrons the number of carriers in the collector is reduced by an amount corresponding to about three times the fluence (where the carrier density is expressed in number per cubic centimeter and the fluence is expressed in number per square centimeter). Thus, if the initial doping is sufficiently high, the width of the base region is retained as the metallurgical width. In this sense, the transit time across the base region remains essentially the same as previous and hence the gain of the transistor is only affected by the decrease in lifetime in the base. In this event the gain falls but still is approximately a factor 3 greater than its prior art power transistor, because the effective basewidth is much smaller subsequent to radiation exposure.

DETAILED DESCRIPTION OF THE INVENTION

Figure 2:
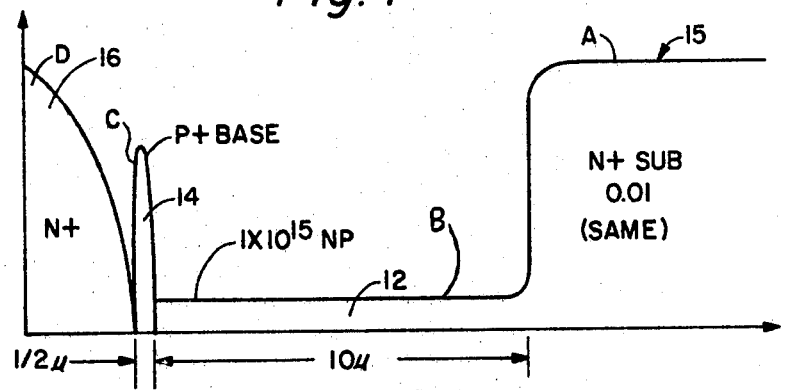
FIG. 2 is an impurity profile taken along the line 2—2 shown in FIG. 1.

Referring to FIGS. 1 and 2 there will be described the prior art transistor and the impurity profiles normally associated with such transistor.

FIG. 1 shows a cross-sectional view of such prior art transistor and FIG. 2 shows an impurity profile corresponding to the various regions shown in FIG. 1.

Referring to FIG. 1 there is shown a substrate 10, and an epitaxial layer 12 formed thereon. A base region is shown at 14 and an emitter at region 16. The base and the emitter regions may be formed by diffusion. The conductivity types shown are used for illustration only and can be of opposite conductivity and the teaching of the present invention will still operate. The substrate 10 is shown as a 0.01 ohm-centimeter resistivity and of N+ conductivity type. The N epitaxial layer 12 is essentially 10 microns thick and it has an impurity concentration of $1 \times 10^{15}$ impurities per cubic centimeter as shown by part A of curve 15 shown in FIG. 2. Since the impurity profile is fashioned by epitaxial deposition, it is essentially constant across the width of the collector region. The collector region 12 has an impurity concentration of $1 \times 10^{15}$ impurities per cubic centimeter as shown in part B of curve 14 shown in FIG. 2. The base region 14 is normally made by diffusion and as such has an impurity profile shown in the portion of the curve in FIG. 2 as C which begins at a relatively low profile and increases toward the collector and then falls back down to again a low impurity level. The emitter region is represented by the portion D of the curve shown in FIG. 2 and is of a standard impurity profile. This emitter area is essentially one-half micron wide and has a concentration of essentially $3 \times 10^{18}$ impurities per cubic centimeter.

Figure 3:
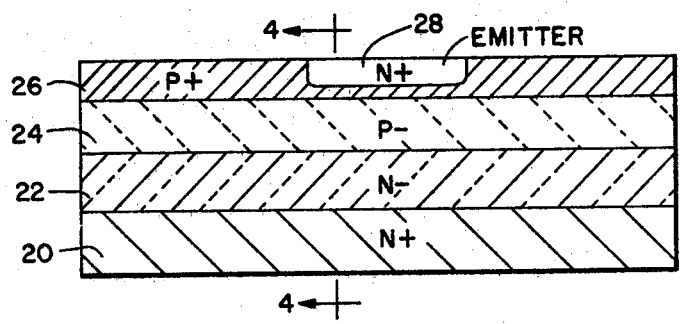
FIG. 3 is a cross-sectional view of a power transistor made according to the present invention.

Referring to FIG. 3 there can be seen a cross-sectional view of the power transistor made according to the present invention.

A substrate is shown at 20. The collector region is shown at 22, a first base region at 24, a second base region is shown at 26, and the emitter is shown at 28.

Figure 4:
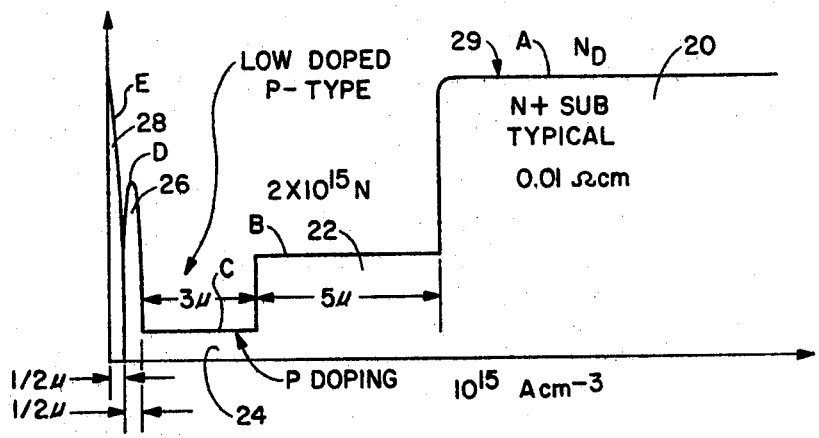
FIG. 4 is an impurity profile taken along the line 4—4 shown in FIG. 3.

The substrate material 20 is essentially the same as that used in the prior art power transistors and is 0.01 ohm centimeter material. This is shown as A of curve 29. The collector region 22 is shown as essentially 5 microns wide as shown in the portion of the curve B shown in FIG. 4. The collector is formed with an impurity concentration of $2 \times 10^{15}$ impurities per cubic centimeter and is shown as part B of curve 29 shown in FIG. 4. This results in a lower breakdown voltage for the power transistor. The base region comprises regions 24 and 26. The intermediate base region 24 is of lower impurity concentration and is essentially 3 microns thick. This is considerably thicker than the second base region 26. The impurity concentration of region 24 is $1 \times 10^{15}$ impurities per cubic centimeter and is shown as part C of curve 29. The impurity concentration of regions 22 and 24 are established during epitaxial deposition. The impurity concentration of the upper base region 26 can be established either by diffusion or in the epitaxial reactor. The impurity concentration of the upper base region 26, shown as FIG. 4 is formed by diffusion and has the standard impurity diffusion profile. This region is shown as part D of curve 29. The heavily doped region 26 is essentially one-half micron thick. The combination of the heavily doped region 26 and the lower doped region 24 contribute over half of the breakdown capability of the power transistor. In this design the two base regions add 60 volts to the breakdown of 100 volts transistor. The emitter region 28 is essentially one-half micron thick and has a doping concentration of $3 \times 10^{18}$ impurities per cubic centimeter, and is represented by part E of curve 29.

Two problems have plagued the development of high-voltage ($\sim$ 100 volt) high-current ($\sim$ 5 amp) power transistors for fluences in the $3 \times 10^{14}$ neutrons cm$^{-2}$ range viz inadequate yield to a preirradiation specification to result in an economic part, and extreme sensitivity of parameters to neutron radiation because the lightly doped collector material ($\sim 10^{15}$cm$^{-3}$) suffers nearly complete carrier removal.

The first of these problems is primarily due to designs which employ very narrow base widths ($<$ 5000A) and large emitter area ($\sim$ 2000 mils$^2$). Because of the narrow base width and large emitter area the probability of an emitter-collector short approaches one. Because the base is very narrow and heavily doped it contributes almost nothing to the voltage capability of the device. Thus to sustain 100 volt BV$_{CEO}$ the collector must be about 10$\mu$ thick 10$^{15}$cm$^{-3}$ material. Since material of this doping density can have very large resistivity increases upon irradiation by $3 \times 10^{14}$ 1 MeV neutrons, the effective base width can easily occupy the entire 10$\mu$ resulting in quite low gains after irradiation. Additionally, if the collector resistivity is not very tightly controlled, gain variation can be tremendous.

Figure 5:
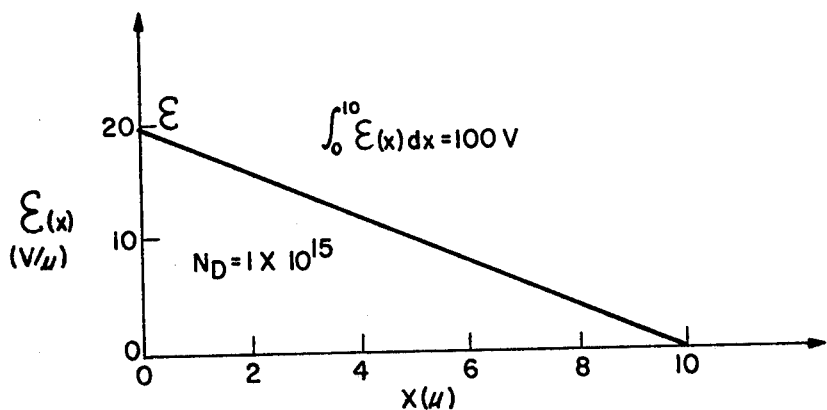
FIG. 5 is an electric field distribution associated with the transistor shown in FIG. 1.
Figure 6:
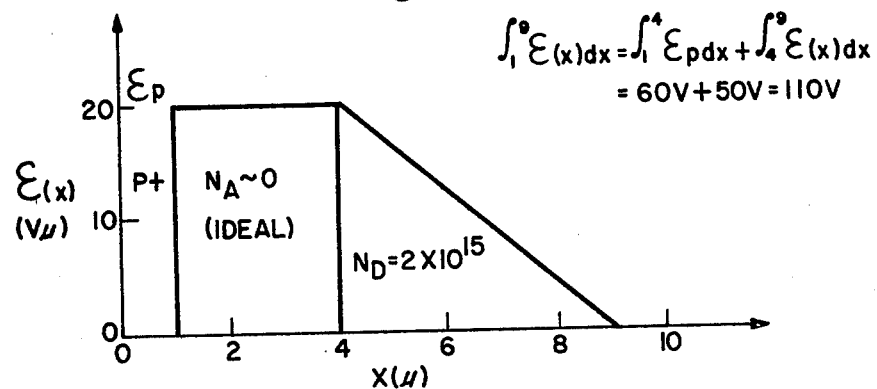
FIG. 6 is an electric field distribution associated with the structure shown in FIG. 3.

By using a lightly-doped base of several microns width, a substantial part of the breakdown voltage can be sustained by the base, so that the collector doping can be augmented to obviate the extreme neutron sensitivity. This point is further illustrated by FIG. 5, which gives electric field (E) versus distance for the conventional profile, assuming a peak E-field of 20V/$\mu$ and 10$^{15}$cm$^{-3}$ doping in the collector. In FIG. 6, the collector doping is doubled, so that its voltage is approximately halved, but the collector side of the base region is very lightly doped and about 3 microns wide, so that it supports about 60V. The emitter side of the base is heavily doped to control Q$_B$ and prevent punch-thru, especially after irradiation when the depletion spread may increase due to neutron damage.

Figure 7:
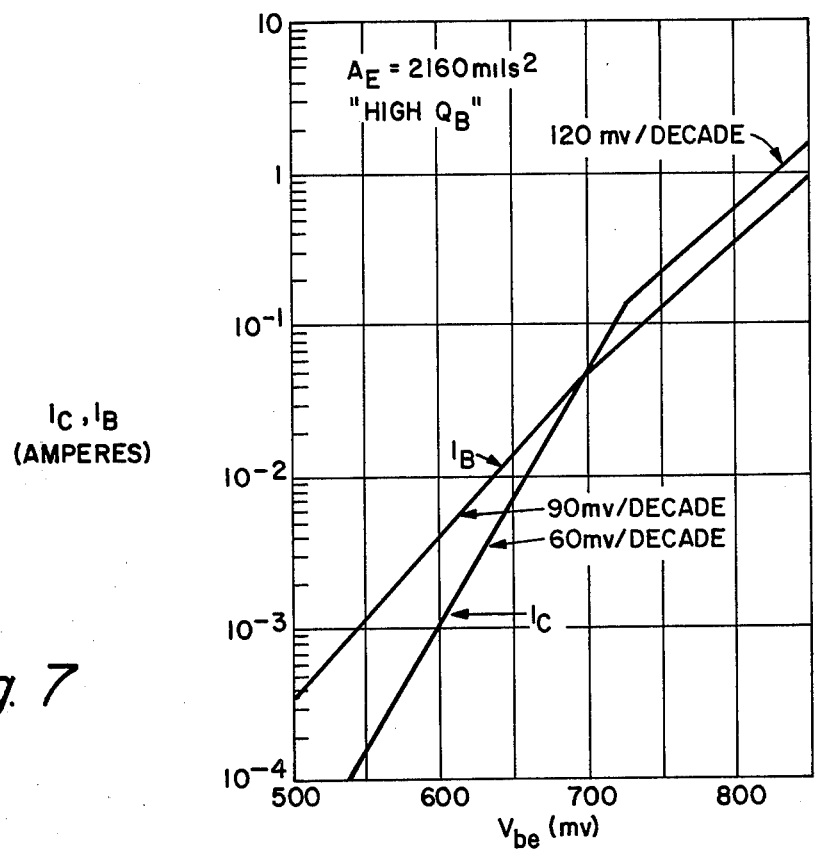
FIG. 7 shows the $J_c$ term versus $V_{BE}$ for a given base width and different $Q_B$ values.
Figure 8:
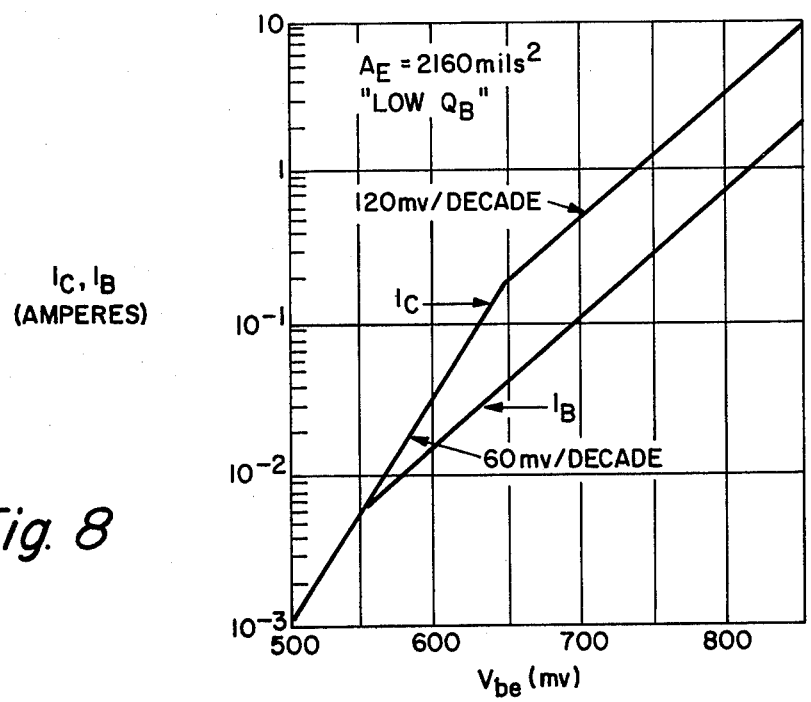
FIG. 8 shows the $J_B$ term versus $V_{BE}$ for a given base width and different $Q_B$ values.
Figure 10:
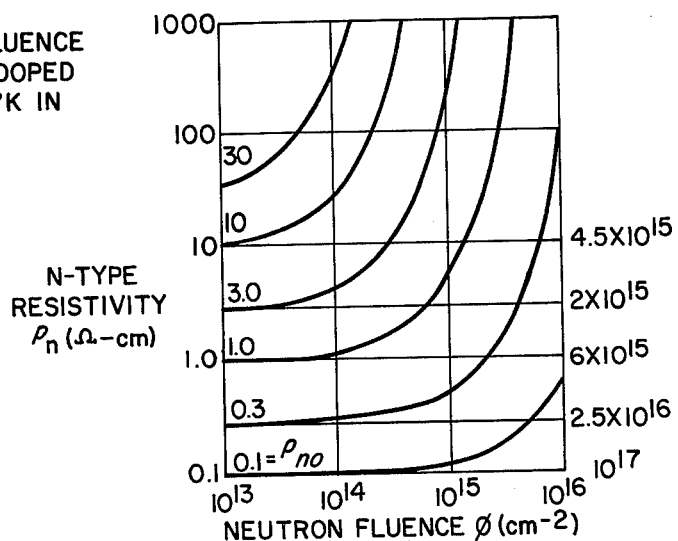
FIG. 10 shows the required doping density of the collector which is required in order to withstand incident neutron fluences.
Figure 11:
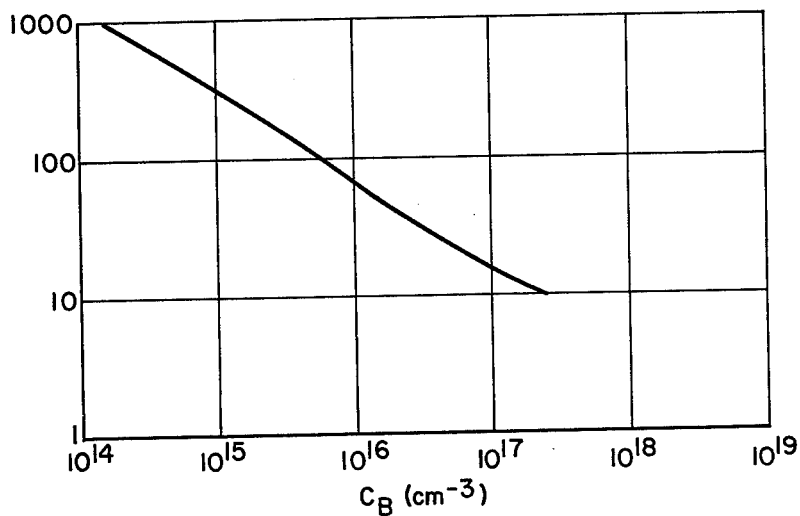
FIG. 11 shows the loss of breakdown voltage attributed to the concentration of impurities in the collector.
Figure 12:
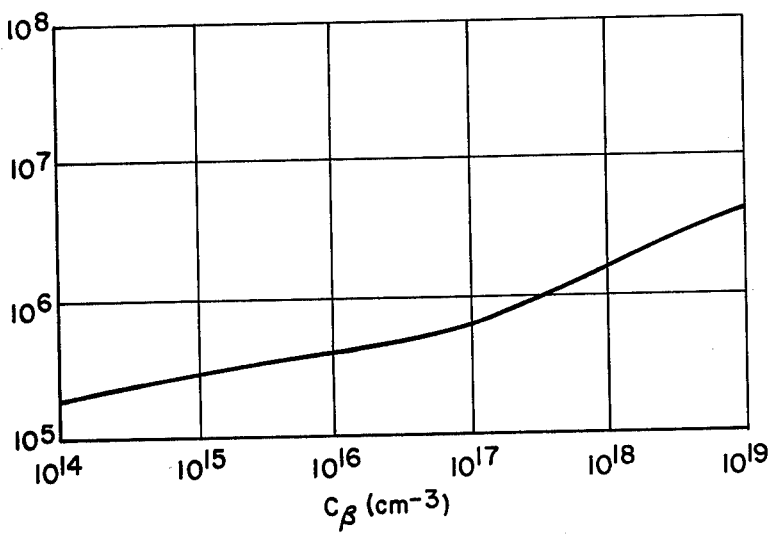
FIG. 12 shows the gain of breakdown voltage attributed to the width of the intermediate base region.

Q$_B$ must be sufficiently large to terminate the electric field and so that preirradiation current gain is not inordinately high, but not so large that post-irradiation current gain is substantially impaired by emitter efficiency. This point is further amplified by FIGS. 7 and 8 which give J$_C$ and J$_B$ versus V$_{BE}$ for a given base width and different Q$_B$ values. The 60mv/decade segment of J$_C$ is due to Q$_B$, while the 120mv/decade slope arise under high-level injection conditions and is a function of the base width. While the J$_C$ dependence will be only slightly modified by neutron irradiation the J$_B$ component will exhibit a 90mv/decade, 120mv/decade, or 60mv/decade dependence depending on whether emitter-base space-charge region recombination, neutral base region recombination, or emitter efficiency respectively is the dominant current gain controlling mechanism. FIG. 7 shows the post-radiation J$_B$ dependence which obtains for a wide base ($\sim$4 micron) device having high Q$_B$ ($\sim 2 \times 10^{13}$cm$^{-2}$), while FIG. 8 is for a structure having a similar base width but much less Q$_B$ ($\sim 3 \times 10^{12}$cm$^{-2}$). Obvious effects from increasing Q$_B$ are (1) an increase in the V$_{BE}$ bias at which high level effects obtain, (2) a reduction in peak gain and therefore exacerbation of current crowding, (3) a reduction in the current range over which gain is flat. FIGS. 7 and 8 illustrate the experimental J$_B$ dependence for the wide base (4 micron) structure and show that the 60mv/decade component of base current is not important for the bias range depicted.

Clearly, if gain were the only design parameter which need be considered then both W and Q$_B$ should be small. Since one or both of these must be large for voltage capability, W should be sufficiently small to give the requisite post-irradiation gain based on the high-level lifetime damage constant, while Q$_B$ should be large enough to preclude punch-through ($1 \times 10^{12}$cm$^{-2}$ at $2 \times 10^5$V cm$^{-1}$) and to keep pre-irradiation gain low enough so that BV$_{CEO}$ is not unduly impaired. The size of the transistor should then be adjusted so that it operates at the high current density end of the 120mv per decade range to minimize photocurrents and maximize yield. It is known that the 60mV per decade emitter efficiency component of irradiated J$_B$ becomes paramount around V$_{BE}$ = 780mV so the design should be centered about this point. Thus where possible high-current high voltage structures should be designed with minimal Q$_B$ and maximum current density.

The major improvement offered by the wide base approach over the classical profile is due to the constraint of the electrical base extension to the metallurgical base region. For a three micron base width the collector current density at 750mV (high-level) is just over 1ma/mil$^2$ while the collector resistance for a 4 micron region doped to $2 \times 10^{15} cm^{-3}$ by $3 \times 10^{14}$ neutrons $cm^{-2}$ is about 300 ohms per $mil^2$. Thus the collector resistance does not add much to the saturation voltage so that high gains may be obtained at the 1 volt level. Irradiated $J_B$ will be on the order of 150 $\mu A/mil^2$ at the same fluence and $V_{BE}$. The collector and base current densities in FIGS. 8 and 9 are slightly lower than these predicted values because of current crowding.

Figure 9:
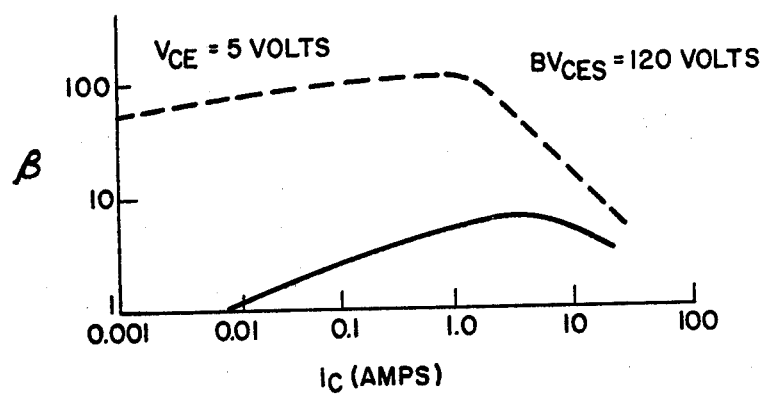
FIG. 9 shows the gain versus collector current for the structure shown in FIG. 3 prior to neutron radiation and after neutron radiation.

The pre-and post-irradiation gain versus collector current data is shown in FIG. 9. The emitter area used for this structure was 2160 $mil^2$. The fluence was $3 \times 10^{14}$ neutrons $cm^{-2}$ (1 MeV equivalent).

It is clear that further improvements in profile can only come from changes which do not materially distort the high-field region dopings, but which may have a significant effect on the irradiated $J_B$–$V_{BE}$ relationship. These effects may be most conveniently studied with small base width structures which enable easy identification of the various base current generating mechanisms.

While the invention has been described with especial reference to two-junction or transistor structures, it will be appreciated that the concept also has application to unitary-junction (diode) devices and to three-junction (thyristor) devices. In the latter case, for example, the two base regions would each comprise a lightly doped subregion with a more heavily doped region (of about $2 \times 10^{12}$ impurities per square centimeter) adjacent to the collateral emitter regions. In this way, minimum basewidth with maximum breakdown voltage is achieved.

While the invention has been particularly shown and described in reference to the preferred embodiments thereof, it will be understood by those skilled in the art that changes in form and details may be made therein without departing from the spirit and scope of the invention.

What is claimed is:

1. A high-voltage silicon transistor for use in radiation environments exceeding $3 \times 10^{14} cm^{-2}$ fast neutron fluence, comprising:

a heavily doped substrate of a first conductivity type having an upper surface, a collector region of said first conductivity type disposed on said substrate, a first base region opposite said first conductivity type over said collector region having a net doping density less than the doping density in said collector region and having a thickness exceeding 2 microns, a second base region of opposite said first conductivity type over said first base region and having a net doping density greater and a thickness less than those of said first base region so that the total doping of both bases is between $2 \times 10^{12}$ and $2 \times 10^{13}$ impurity atoms per square centimeter, and, an emitter formed over said second base region.

2. The combination comprising:

the transistor of claim 1, and means for exposing said transistor to fast neutron fluence exceeding $3 \times 10^{14}$ neutrons $cm^{-2}$.

3. A method for fabricating high-voltage transistors for use after sustaining a fast neutron fluence in excess of $3 \times 10^{14} cm^{-2}$, comprising, the steps of:

providing a heavily doped substrate of a first conductivity type having an upper surface, depositing a collector region of said first conductivity type on said substrate, depositing a first base region of opposite said first conductivity type and having a net doping density less than said collector region and a thickness exceeding 2 microns over said collector region, forming a second base region of opposite said first conductivity type and having a greater doping density than that of said first base region, and diffusing an emitter region of said first conductivity type into said second base region so that the total doping of the base between the collector and emitter regions is between $2 \times 10^{12}$ and $2 \times 10^{13}$ impurity atoms per square centimeter.

* * * * *